United States Patent [19]

Spotts

[11] Patent Number: 4,636,126
[45] Date of Patent: Jan. 13, 1987

[54] ELECTRICAL CONNECTOR PICKUP STATION

[75] Inventor: Kenneth L. Spotts, Elizabethtown, Pa.

[73] Assignee: AMP Incorporated, Harrisburg, Pa.

[21] Appl. No.: 704,801

[22] Filed: Feb. 25, 1985

[51] Int. Cl.⁴ .......................................... B65G 47/06
[52] U.S. Cl. ................................. 414/126; 221/171; 221/242; 269/58; 269/903; 414/224; 414/225; 414/741; 414/779; 414/782
[58] Field of Search ............... 414/126, 224, 225, 742, 414/779, 741, 782, 222; 221/238, 241, 242, 292, 171; 269/903, 58; 29/741

[56] References Cited

U.S. PATENT DOCUMENTS

| | | | |
|---|---|---|---|
| 1,679,527 | 8/1928 | Jaeger | 414/779 X |
| 2,891,698 | 6/1959 | Kottas | 221/242 X |
| 2,997,779 | 8/1961 | Smart | 29/741 |
| 3,473,676 | 10/1969 | Cotney | 414/126 |
| 3,545,064 | 12/1970 | Zemek et al. | 29/741 X |
| 3,960,056 | 6/1976 | Holstein et al. | 414/225 X |
| 4,149,641 | 4/1979 | De Vita | 414/126 |
| 4,567,652 | 2/1986 | Gussman et al. | 29/741 |

*Primary Examiner*—Robert J. Spar
*Assistant Examiner*—Janice Krizek
*Attorney, Agent, or Firm*—Thomas G. Terrell

[57] ABSTRACT

An electrical connector pickup station for long electrical connectors, comprises an escapement assembly for receiving connectors from a gravity feed magazine and which is mounted above a base plate so as to be inclined in a vertical plane. A connector locating assembly, also mounted on the base plate, is pivotable and translatable between a first inclined position in alignment with the escapement assembly to receive a connector therefrom, and a second horizontal position in which the connector can be picked up from the locating assembly by the jaws of a robot or pick-and-place machine. A device is provided for securing the connector in the locating assembly during its movement.

11 Claims, 10 Drawing Figures

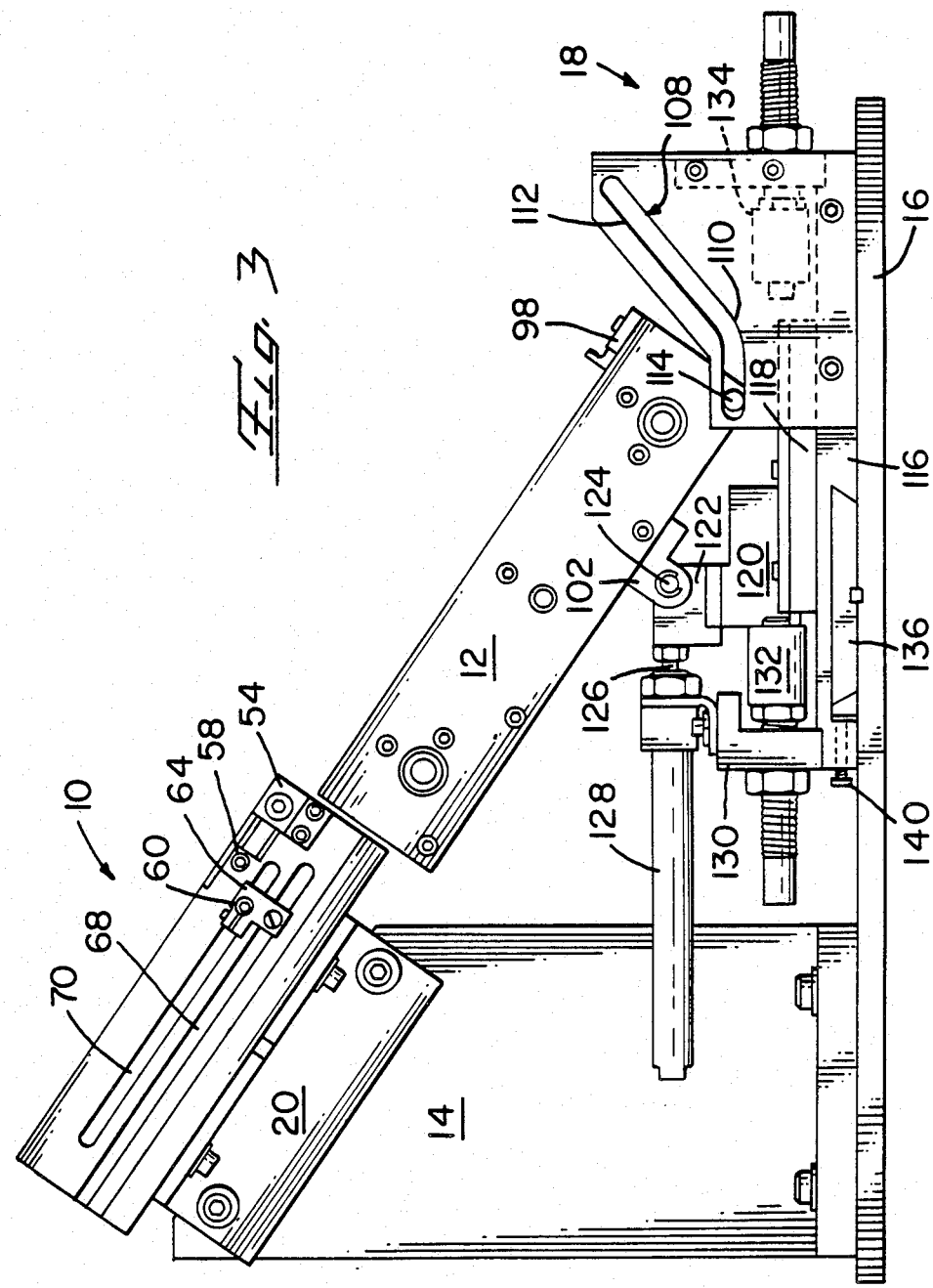

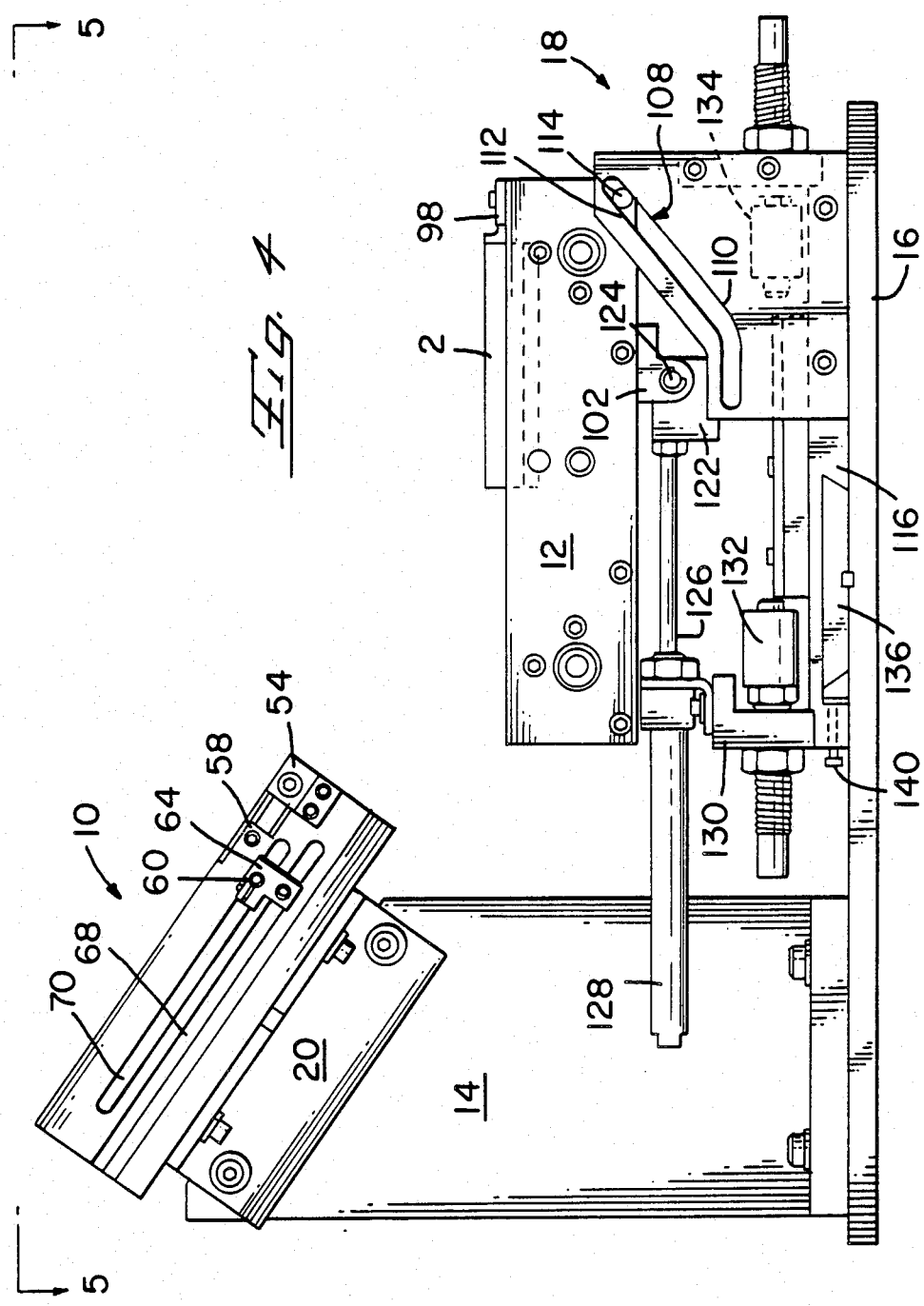

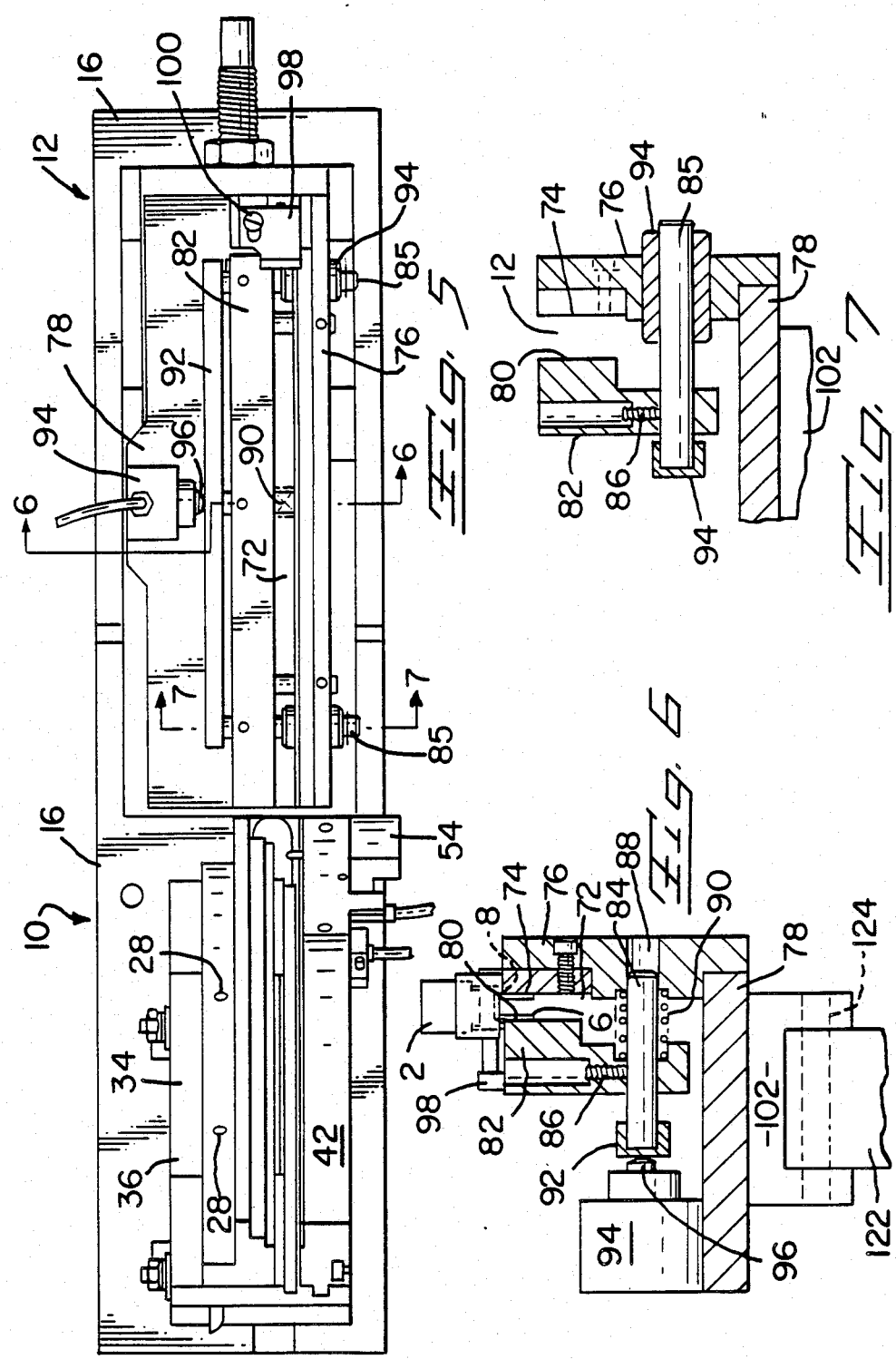

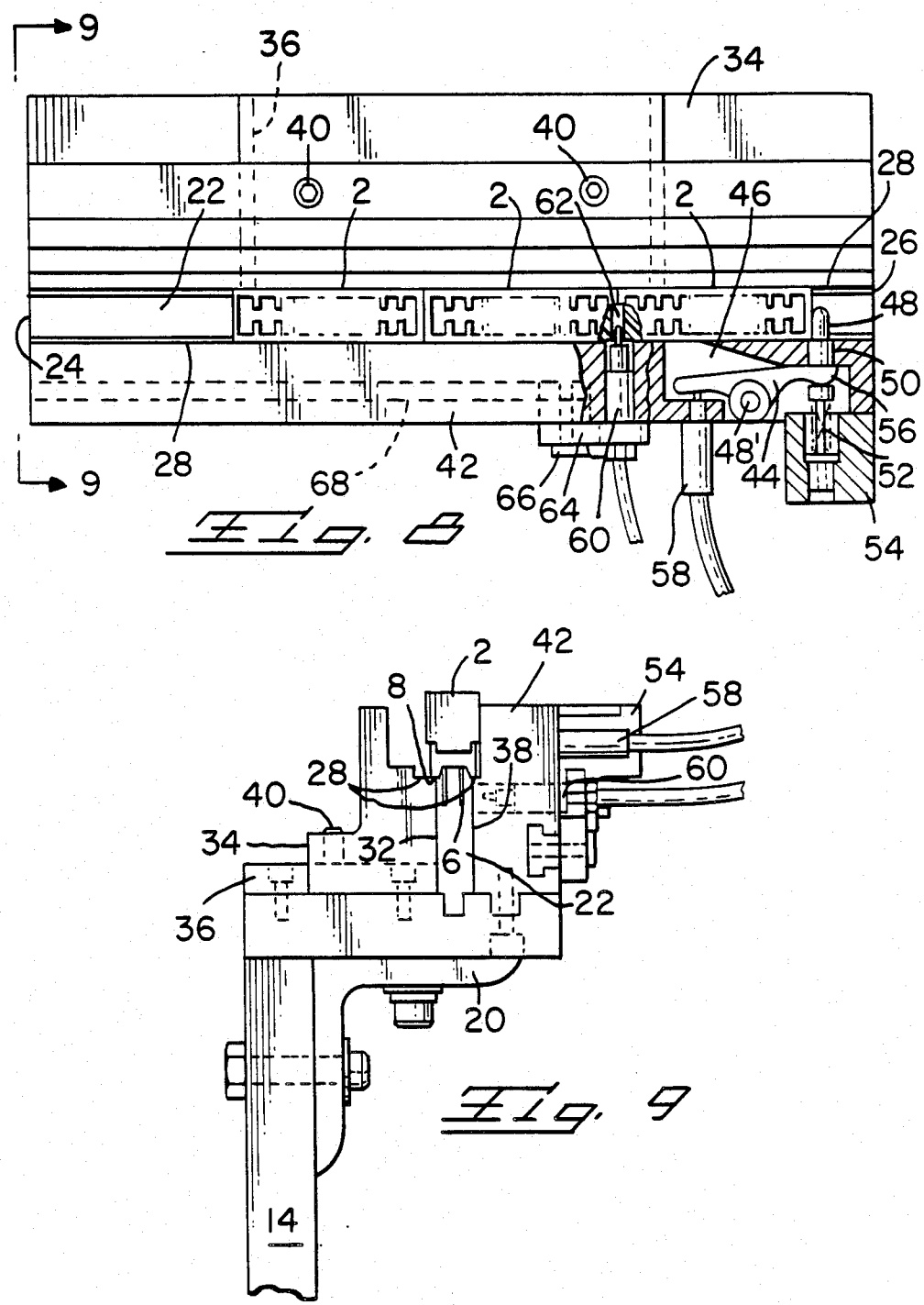

ELECTRICAL CONNECTOR PICKUP STATION

This invention relates to an electrical connector pickup station, especially, but not exclusively, for use with a robot for assembling electrical connectors to a circuit board.

There is described in U.S. patent application Ser. No. 663,790 which was filed on Oct. 23, 1984, now U.S. Pat. No. 4,611,846, and which is hereby incorporated by reference herein, a gripper head for attachment to an arm of a robot and which is provided with a pair of jaws, which may be in the form of a pair of flat plates, for picking up an electrical connector from an electrical connector pickup station and transferring the connector to a predetermined position on a circuit board. It is desirable that such a pickup station should be automatically fed with connectors to be positioned one-by-one at a location to be picked up by the gripper head on the arm of the robot. The most practical way of feeding such a pickup station with connectors is by means of a gravity feed magazine arranged to release a connector at a time into the pickup station. However, such a feeding operation cannot be carried out both accurately and rapidly, where the connectors concerned are several inches in length, for example nine inches in length, as may often be the case. Rapidity in feeding the connectors to the pickup location is essential where a robot is used for transporting the connectors, since it may take little more than a second for the robot to carry the gripper head from the pickup station to the circuit board and back again.

According to the present invention therefore, an electrical connector pickup station comprises a base; an escapement assembly mounted on the base and defining an open-ended electrical connector supply channel for slidably receiving elongate electrical connectors arranged in end-to-end relationship, the supply channel being inclined in a vertical plane and thereby having an upper and a lower end; escapement means movable into and out of said supply channel to allow a connector at a time to fall from the lower end thereof; a connector locating assembly defining a connector locating channel for slidably receiving a connector at a time from the supply channel and having a first, open end nearest to the escapement assembly and a second, closed end remote therefrom; means supporting the locating assembly on the base, for translatory and tilting movement between a first position in which the first end of the locating channel is in alignment with, and is proximate to, the lower end of the supply channel and a second position in which the locating channel is substantially horizontal; means for actuating the escapement means to allow a connector to fall from the supply channel into the locating channel when the locating assembly is in its first position; means for driving the locating assembly between its first and its second positions; and means for releasably retaining the connector in the locating channel during movement of the locating assembly from its first to its second position.

Connectors can be fed into the supply channel from a gravity feed magazine which opens above the upper end of the supply channel, and can be properly placed in a horizontal position for pickup by means of the locating assembly, which can be dimensioned to receive a connector of substantially any length. By virtue of the retaining means, the connector cannot be jerked out of the locating channel during the movement of the locating assembly, which should be rapid especially where the connector is to be picked up by a robot.

The means for supporting the locating assembly on the base preferably comprise a cam plate thereon having a slot for receiving a cam follower on the assembly, the slot having a horizontal portion nearest to the escapement assembly, merging into an outwardly inclined portion, whereby the necessary translatory and tilting movements of the locating assembly are achieved.

The means for driving the locating assembly may comprise a piston and cylinder unit secured to the base and having a piston rod attached to a carriage movable along the base and to which the locating assembly is pivotally connected.

The escapement means are preferably adjustable to allow for differences in connector length.

In order to ensure that in the first position of the locating assembly, the locating channel is precisely aligned with the supply channel of the escapement assembly, the locating assembly and its drive means are preferably adjustable transversely of said channels.

For a better understanding of the invention, and to show how it may be carried into effect, reference will now be made by way of example to the accompanying drawings in which:

FIG. 1A is a perspective view of an electrical connector for use with the assembly;

FIG. 3 is a side view of the connector pickup station as shown in FIG. 1;

FIG. 4 is a side view of the connector pickup station as shown in FIG. 2;

FIG. 5 is a view taken on the lines 5—5 of FIG. 4;

FIG. 6 is a view taken on the lines 6—6 of FIG. 5;

FIG. 7 is a view taken on the lines 7—7 of FIG. 5;

FIG. 8 is a plan view of the escapement assembly; and

FIG. 9 is a view taken on the lines 9—9 of FIG. 8.

An electrical connector 2, as shown in FIG. 1A, comprises an insulating housing 4 containing two rows of electrical terminals each having a post portion 6 for reception in a hole in a circuit board. The housing 4 is formed with a pair of opposite longitudinal shoulders 8 which face downwardly (as seen in FIG. 1A).

Figure 1:
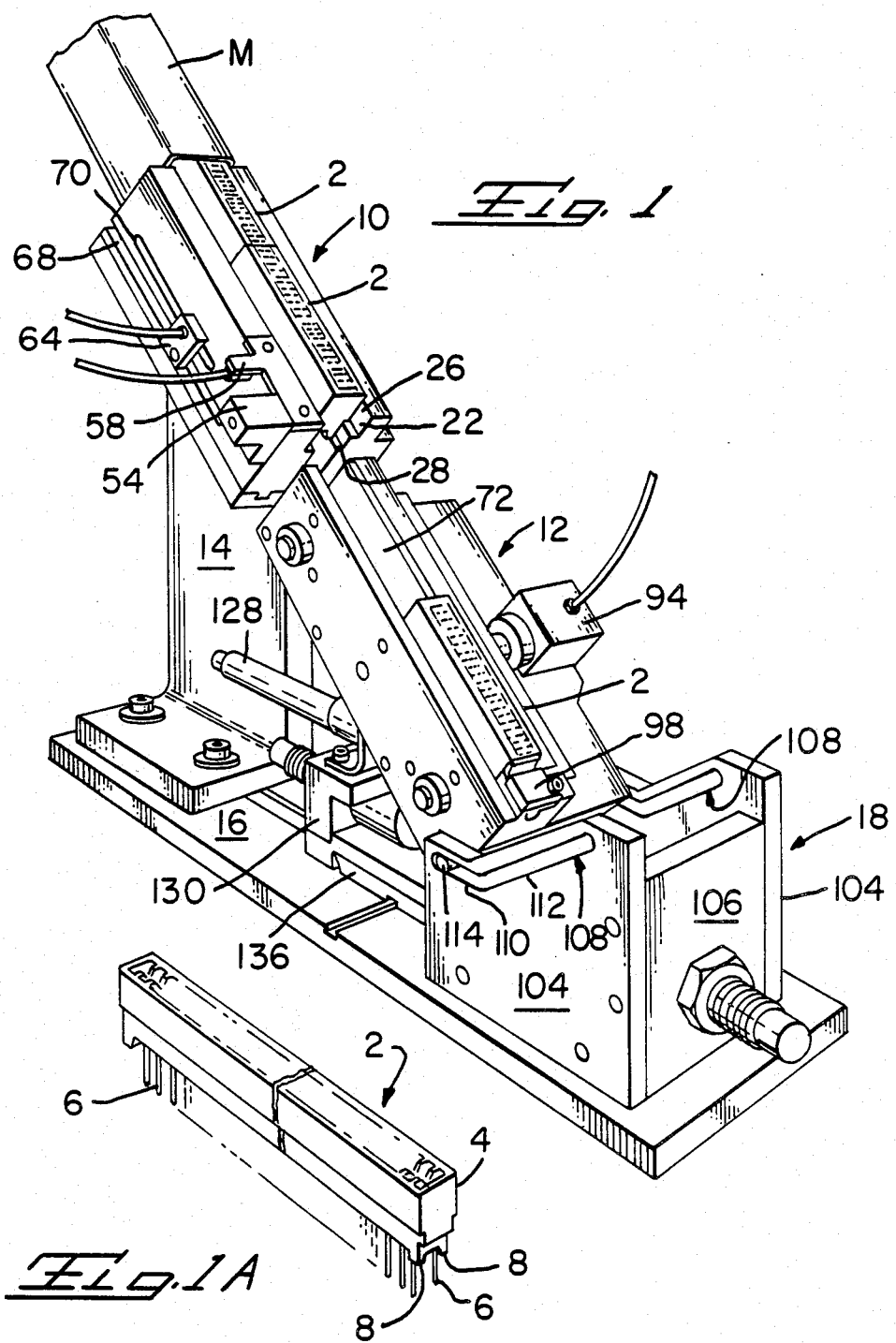
FIG. 1 is a perspective view of an electrical connector pickup station showing a connector locating assembly of the station in a position to receive a connector from an escapement assembly of the station.
Figure 2:
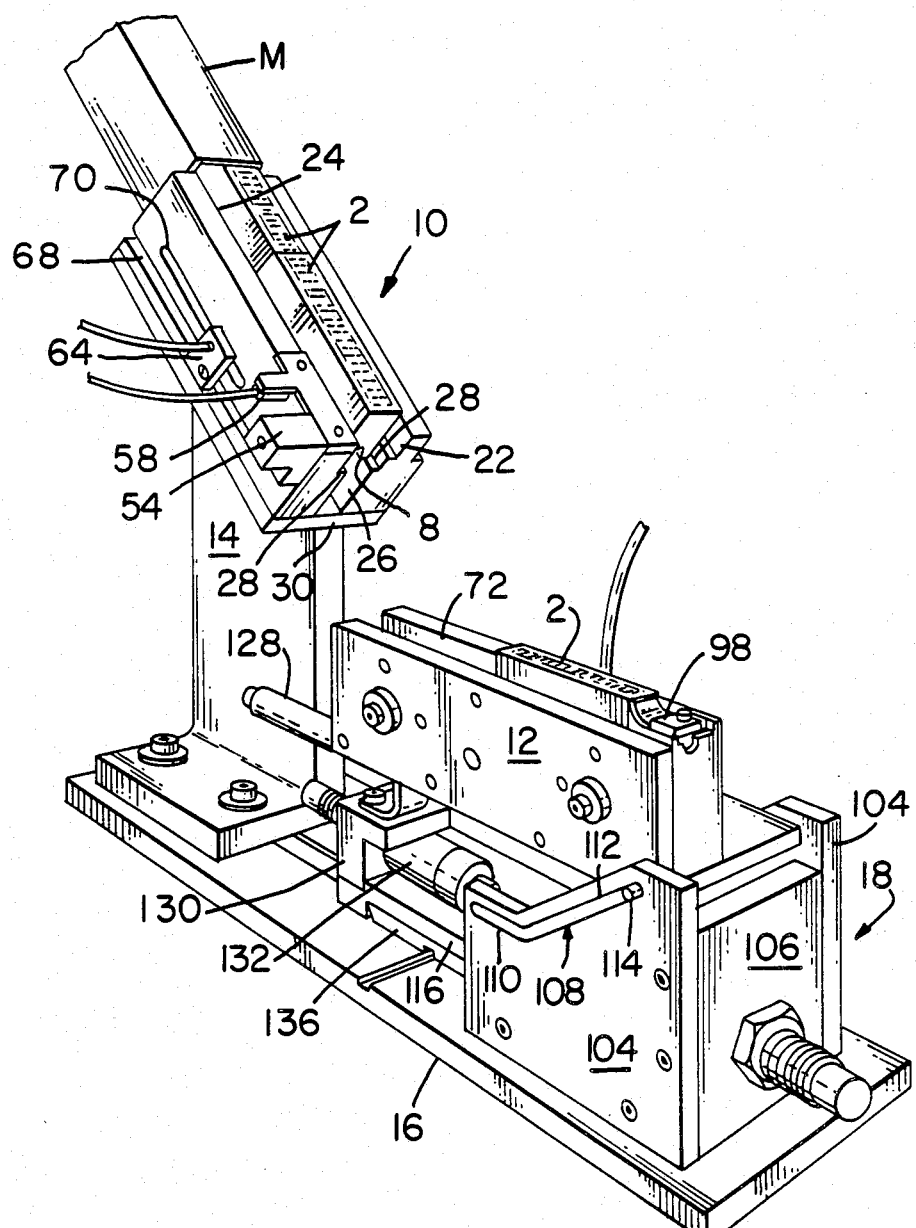
FIG. 2 is a similar view to that of FIG. 1 but showing the locating assembly in a horizontal position.

As shown in FIGS. 1, 2, 3 and 4, the connector pickup station comprises an escapement assembly 10 and a connector locating assembly 12. The assembly 10 is supported on a frame plate 14 upstanding from a base 16, so as to be inclined, in a vertical plane, with respect to the base 16. The assembly 12 is supported by means generally referenced 18 on the base 16 for translatory and tilting movement with respect to the assembly 10 between the position in which the assembly 12 is shown in FIGS. 1 and 3 and the position in which it is shown in FIGS. 2 and 4.

The assembly 10, which is secured to the frame plate 14 by means of a bracket 20, defines a connector-receiving channel 22 having an upper end 24 and a lower end 26, the ends 24 and 26 both being open. The walls of the channel 22 are formed with a pair of opposite shoulders 28 directed away from the base 30 of the channel 22 for sliding engagement with the shoulders 8 of a row of connectors 2. As best seen in FIGS. 8 and 9, one wall 32 of the channel 22 is provided by a block 34 which is slidable on a dovetail block 36 secured to the base 30, towards and away from the opposite wall 38 of the channel 22, and can be secured at a desired distance therefrom by means of screws 40 to allow for connector width. The wall 38 is provided on a second block 42 which is fixedly attached to the base 30.

As shown in FIG. 8, a rocker arm 44 received in a recess 46 in the block 42 is mounted on a pivot pin 48' near the lower end 26 of the channel 22. To the right-hand (as seen in FIG. 8) end of the arm 44 there is secured an escapement pin 48 which is slidably received in a bore 50 in the block 42 for movement into and out of the channel 22, being urged inwardly of the channel 22 by a return spring 52 in a support block 54 secured to the block 42, the spring 52 engaging a lobe 56 on the arm 44. The other end of the arm 44 is urged by the spring 52 against the piston rod of a pneumatic piston and cylinder unit 58 which is actuable to drive the arm 44 in a clockwise (as seen in FIG. 8) sense against the action of the spring 52 to withdraw the escapement pin 48 from the channel 22. A further pneumatic piston and cylinder unit 60, the piston rod of which has thereon a further escapement pin 62 which is displaced from the escapement pin 48 in the direction of the end 24 of the channel 22, is mounted on a plate 64 through which passes a screw 66 engageable in a slot 68 in the block 42, the unit 60 extending through a further slot 70 in the block 42 (see FIGS. 1, 2, 3 and 4) whereby the position of the pin 62 is adjustable lengthwise of the channel 24 to allow for connector length. The screw 66 can be tightened to secure the plate 64 in a desired position lengthwise of the channel 24.

The assembly 12 defines a channel 72, one wall 74 of which is provided by a block 76 secured to a base 78 and the other wall 80 of which is provided by a block 82 (FIGS. 5 to 7) mounted on shafts 84 and 85 and being adjustable lengthwise thereof by loosening screws 86 in the block 82. The shaft 84 is slidably engaged at one end in a bore 88 in the block 76 as shown in FIG. 6, being movable into the bore 88 against the action of a return spring 90. The shafts 85 are slidable in bushings 94 in the block 76. At their ends remote from the block 76, the shafts 84 and 85 are ganged by a channel bar 92. Centrally of the length of the channel 72, there is mounted to the base 78 a further pneumatic piston and cylinder unit 94 (FIG. 5) having a piston rod 96 engaging the bar 92 and being extensible to drive the block 82 towards the block 76 against the action of the spring 90. Mounted at the end of the channel 72 remote from the assembly 10 is a connector stop 98 which can be adjusted to a limited extend lengthwise of the channel 72 by loosening a screw 100 engaging in a slot in the stop 98. On the bottom wall of the base 78 is a clevis 102.

The supporting means 18 for the assembly 12 comprises a pair of spaced cam plates 104 (FIGS. 1, 2, 3 and 4) spanned by an end plate 106 and being formed with cam slots 108 each comprising a horizontal portion 110 nearest to the frame plate 14, which merges with a portion 112 which is upwardly inclined with respect to the base 16, in a direction away from the portion 110. Each slot 108 receives a cam follower in the form of a trunnion 114 at the end of the assembly 12 remote from the plate 14 and positioned at the bottom right-hand (as seen in FIGS. 1, 2, 3 and 4) of the assembly 12. Mounted on the base 16, on a support plate 116, are slide plates 118 along which a carriage 120 for the assembly 12 is slidable towards and away from the frame plate 14. The carriage 120 is surmounted by a block 122 (FIG. 3) which is received in the clevis 102 and is pivotally connected thereto by means of a pin 124. The block 122, which is fixed with respect to the carriage 120, is secured to the piston rod 126 of a pneumatic piston and cylinder unit 128 secured to a bracket 130, which is in turn secured to the plate 116. Shock absorbers 132 and 134 for the carriage 120 are mounted in the bracket 130 and in the plate 106, respectively. The plate 116 is slidable on a dovetail block 136, to which the dovetail block 36 is similar, keyed to the plate 116 at 138 and can be secured at a desired position transversely of the base 116 by means of a screw 140. Thus, the slide plates 118, the unit 128, and the assembly 12 can be adjusted laterally, to align the channel 72 with the channel 22 of the assembly 10.

In order to set up the pickup station for use with connectors 2, the screws 40 of the assembly 12 are loosened and the block 34 is adjusted so that connectors 2 can slide along the channel 22 with their shoulders 8 resting on the shoulders 28 and the screws 40 are then tightened. The plate 64 is set at a position lengthwise of the slots 68 and 70 so that a connector 2 can be snugly received between the pins 48 and 62 as shown in FIG. 8. The block 82 is adjusted, after loosening the screws 86, lengthwise of the shafts 84 and 85 to ensure that a connector 2 can slide in the channel 72 with its shoulders 8 resting on the tops of the blocks 76 and 82, and the screws 86 are then retightened. The stop 98 is set, after loosening the screw 100, at a desired position, and the screw 100 is then retightened. The channel 72 of the assembly 12 is then aligned with the channel 22 of the assembly 10, after loosening the screw 140 and moving the assembly 12 to its FIGS. 1 and 3 position, after which the screw 140 is retightened.

The piston and cylinder units 58, 60, 94 and 128 are operated under the control of a microprocessor of the mother machine, which will usually be a robot or a pick-and-place machine, arranged to pick up connectors 2 from the connector pickup station.

As shown in FIGS. 1 and 2, the pickup station is positioned with the upper end 24 of the channel 22 in alignment with a magazine M down which connectors 2 arranged in end-to-end relationship are slidable under the action of gravity. For operation, the assembly 12 is initially placed in its raised position as shown in FIGS. 1 and 3, and the pin 48 in its advanced position projecting into the channel 22, and the magazine M is charged. The channel 22 is thereby filled with connectors 2 which have slid thereinto from the magazine M, the leading connector abutting the pin 48. The pin 62 is then advanced so that the next following connector 2 rests thereagainst, as shown in FIG. 8. With the parts so positioned, the unit 58 is actuated to swing the lever 44 against the action of the spring 52 to retract the pin 48 from the channel 22 so that the leading connector 2 is released so as to slide down the channel 72 of the assembly 12 until it is halted by the stop 98 as shown in FIG. 1. The pin 48 is then advanced again by the unit 58 and the pin 62 is retracted by the unit 60 so that said next following connector 2 slides downwardly along the channel 22 until it is halted by the pin 48. The pin 62 is then advanced again.

The unit 94 is then actuated to advance its piston rod 96, to move the block 82 towards the block 76 against the action of the spring 90, so that the post portions 6 of the connector 2 in the channel 72 are gripped between these blocks. The unit 128 is then actuated to advance its piston rod 126 so that by virtue of the engagement of the trunnions 114 in the portion 110 of the cam slot 108, the assembly 12 is translated away from the assembly 10 and then, by virtue of the engagement of the trunnions 114 in the portion 112 of the slot 108, is swung to the horizontal position in which the assembly 12 is shown in FIGS. 2 and 4. Since the post portions 6 of the connector 2 in the channel 72 are gripped between the blocks 78 and 82, the connector in the channel 72 is not displaced as a result of these movements, which must of course be rapid, for the reasons mentioned above. Finally, the unit 94 is operated to retract its piston rod 96 so that the block 82 is moved away from the block 76 under the action of the spring 90, whereby the connector 2 in the channel 72 is freed to be picked up by the jaws of the robot or pick-and-place machine and transported to a work station. The unit 128 is then actuated to retract its piston rod 126 so that the assembly is returned to its raised, FIGS. 1 and 3 position, ready for a fresh cycle of operation.

What is claimed is:

1. An electrical connector pickup station, comprising:
    a base;
    an escapement assembly mounted on the base and defining an open-ended electrical connector supply channel for slidably receiving elongate electrical connectors arranged in end-to-end relationship, the supply channel being inclined in a vertical plane and thereby having an upper and a lower end;
    escapement means movable into and out of said supply channel to allow a connector at a time to fall from the lower end thereof;
    a connector locating assembly defining a connector locating channel for slidably receiving a connector at a time from the supply channel and having a first, open end nearest to the escapement assembly and a second, closed end remote therefrom;
    means supporting the locating assembly on the base for translatory and tilting movement between a first position in which the first end of the locating channel is in alignment with, and is proximate to, the lower end of the supply channel and a second position in which said locating channel is substantially horizontal, said supporting means comprising a cam plate having a cam slot receiving a cam follower on the location assembly, the cam slot having a horizontal first portion nearest to the escapement assembly, merging with a second portion which is upwardly inclined in a direction away from the escapement assembly;
    means for actuating the escapement means to allow a connector to fall from the supply channel into the locating channel when the locating assembly is in its first position;
    means for driving the locating assembly between its first and its second positions; and
    means for releasably retaining the connector in the locating channel during movement of the locating assembly from its first to its second position.

2. A pickup station as claimed in claim 1, wherein the means for retaining the connector in the locating channel comprises a piston and cylinder unit actuable to move a first wall of the channel towards a second wall thereof against the action of return means.

3. A pickup station as claimed in claim 2, wherein said first wall is provided by a block mounted on shafts extending transversely of the locating channel and being connected together by a bar engageable by the piston rod of the piston and cylinder unit.

4. A pickup station as claimed in claim 1, wherein the escapement means comprises a first pin proximate to the lower end of the supply channel and a second pin spaced from the first pin towards the upper end of the supply channel, each pin having a first position in which the pin obstructs the supply channel and a second position in which the pin is withdrawn from the supply channel, the second pin being adjustable lengthwise of the supply channel.

5. A pickup station as claimed in claim 4, wherein the first pin is mounted on a lever pivoted to the escapement assembly, a piston and cylinder unit being provided to withdraw the first pin from the supply channel against the action of return means, the second pin being mounted on the piston rod of a second piston and cylinder unit secured to the escapement assembly.

6. A pickup station as claimed in claim 1, wherein a first wall of the locating channel is mounted to slide towards and away from a second wall of the locating channel, means being provided for securing the first wall at a desired position with respect to the second wall.

7. A pick-up station as claimed in claim 1, wherein said means for driving the locating assembly comprises a piston and cylinder unit mounted on the base, and being connected to a carriage movable horizontally towards and away from the escapement assembly and to which the locating assembly is pivotally connected, the carriage and the piston and cylinder unit being mounted on the base for adjustment transversely of said supply channel to align the locating channel with the supply channel.

8. An electrical connector pickup station, comprising:
    a base;
    an escapement assembly mounted on the base and defining an open-ended electrical connector supply channel for slidably receiving elongate electrical connectors arranged in end-to-end relationship, the supply channel being inclined in a vertical plane and thereby having an upper and a lower end;
    escapement means movable into and out of said supply channel to allow a connector at a time to fall from the lower end thereof;
    a connector locating assembly defining a connector locating channel for slidably receiving a connector at a time from the supply channel and having a first, open end nearest to the escapement assembly and a second, closed end remote therefrom;
    means supporting the locating assembly on the base for translatory and tilting movement between a first position in which the first end of the locating channel is in alignment with, and is proximate to, the lower end of the supply channel and a second position in which said locating channel is substantially horizontal;
    said supporting means comprising a cam plate having a cam slot receiving a cam follower on the locating assembly, the cam slot having a horizontal first portion nearest to the escapement assembly, merging with a second portion which is upwardly inclined in a direction away from the escapement assembly;
    means for actuating the escapement means to allow a connector to fall from the supply channel into the locating channel when the locating assembly is in its first position;
    means for driving the locating assembly between its first and its second positions; and means for releasably retaining the connector in the locating channel during movement of the locating assembly from its first to its second position and wherein said means for driving the locating assembly comprises a piston and cylinder unit mounted on the base, and being connected to a carriage movable horizontally towards and away from the escapement assembly and to which the locating assembly is pivotally connected, the carriage and the piston and cylinder unit being mounted on the base for adjustment transversely of said supply channel to align the locating channel with the supply channel.

9. A pick-up station as claimed in claim 8, wherein the means for retaining the connector in the locating channel comprises a second piston and cylinder unit actuable to move a first wall of the channel towards a second wall thereof against the action of return means, said first wall being provided by a block mounted on shafts extending transversely of the locating channel and being connected together by a bar engageable by the piston rod of the second piston and cylinder unit.

10. A pick-up station as claimed in claim 8, wherein the escapement means comprises a first pin proximate to the lower end of the supply channel and a second pin spaced from the first pin towards the upper end of the supply channel, each pin having a first position in which the pin obstructs the supply channel and a second position in which the pin is withdrawn from the supply channel, the second pin being adjustable lengthwise of the supply channel, the first pin being mounted on a lever pivoted to the escapement assembly, a third piston and cylinder unit being provided to withdraw the first pin from the supply channel against the action of return means, the second pin being mounted on the piston rod of a fourth piston and cylinder unit secured to the escapement assembly.

11. An electrical connector pickup station, comprising:
- a base;
- a frame plate upstanding from the base;
- an elongate escapement assembly mounted to the frame plate at a predetermined angle of inclination in a vertical plane and thereby having an upper and a lower end;
- means in said assembly defining a connector-receiving supply channel opening into said upper and said lower ends;
- a first escapement member movable into and out of said supply channel at a position proximate to said lower end;
- a second escapement member spaced from said first escapement member towards said upper end of said supply channel, the second escapement member being movable into and out of said channel and being adjustable lengthwise thereof;
- a connector locating assembly mounted on said base and having a first end nearest to said frame plate and a second end remote therefrom;
- means in said locating assembly defining a connector locating channel opening into said first end of said locator assembly and extending towards said second end;
- means obturating said locating channel at a position proximate to said second end thereof;
- a carriage slidably mounted on said base for movement towards and away from said frame plate and being pivotally connected to said locating assembly intermediate the ends thereof;
- cam followers proximate to, and on opposite sides of, said second end of the locating assembly;
- a pair of spaced cam plates upstanding from said base and each defining a cam slot receiving a respective one of said cam followers, each cam slot having a horizontal portion nearest to said frame plate and a portion which is upwardly inclined in a direction away from said frame plate and said base;
- means for driving said carriage towards and away from said frame plate to move said locating assembly between a first position in which said locating channel is aligned with said supply channel and a second position in which said locating channel is parallel with said base; and
- means for releasably retaining a connector in said locating channel.

* * * * *